(12) United States Patent
Taussig et al.

(10) Patent No.: US 6,980,465 B2
(45) Date of Patent: Dec. 27, 2005

(54) ADDRESSING CIRCUIT FOR A CROSS-POINT MEMORY ARRAY INCLUDING CROSS-POINT RESISTIVE ELEMENTS

(75) Inventors: Carl Taussig, Redwood City, CA (US); Warren Jackson, San Francisco, CA (US); Hao Luo, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 129 days.

(21) Appl. No.: 10/739,350

(22) Filed: Dec. 19, 2003

(65) Prior Publication Data

US 2005/0135146 A1   Jun. 23, 2005

(51) Int. Cl.[7] ............................................. G11C 11/00
(52) U.S. Cl. ........................ 365/158; 365/148; 365/243
(58) Field of Search ................................. 365/105, 148, 365/175, 243

(56) References Cited

U.S. PATENT DOCUMENTS

| | | | |
|---|---|---|---|
| 6,385,075 B1 | 5/2002 | Taussig et al. | |
| 6,552,409 B2 | 4/2003 | Taussig et al. | |
| 6,567,295 B2 * | 5/2003 | Taussig et al. | ............. 365/105 |
| 6,646,912 B2 | 11/2003 | Hurst et al. | |

* cited by examiner

*Primary Examiner*—Tan T. Nguyen

(57) ABSTRACT

An addressing circuit is operable to address one or more memory elements in a cross-point memory array. The addressing circuit includes first and second sets of address lines for addressing the cross-point memory array. The address circuit also includes pull-up and pull-down circuit elements. Both the pull-up and pull-down circuit elements and the address lines include cross-point resistive elements.

29 Claims, 8 Drawing Sheets

ADDRESSING CIRCUIT FOR A CROSS-POINT MEMORY ARRAY INCLUDING CROSS-POINT RESISTIVE ELEMENTS

TECHNICAL FIELD

This invention relates generally to digital memory circuits. More particularly, the invention relates to an addressing circuit for a memory circuit.

BACKGROUND

Many consumer devices generate and utilize digital data in increasingly large quantities. Portable digital cameras for still and/or moving pictures, for example, generate large amounts of digital data representing images. Each digital image may require up to several megabytes (MB) of data storage.

One form of storage device currently used in portable devices such as digital cameras is Flash memory. Flash memory is generally mechanically robust, is low power, and has good data transfer characteristics. However, Flash memory remains relatively expensive, such as $1.50–$2 per MB. Because of the price it is generally unreasonable to use Flash memory as an archive device, thus requiring data to be transferred from it to a secondary archival storage. Also, it becomes prohibitively expensive to include a large amount of Flash memory in an inexpensive digital camera or similar digital appliance, such as an MP3 player or PDA. This can make certain features unavailable for various applications, such as recording video on an inexpensive digital camera, and can impair the function of other features, such as limiting the number of pictures a digital camera can store or the number of songs an MP3 player can store.

Magnetic "hard disc" storage is typically used for archival storage, even in portable devices. Miniature hard disc drives are available for the PCMCIA type III form factor, offering capacities of up to 4 GB. However, such disc drives are still relatively expensive at least partially because of the relatively high fixed cost of the disc controller electronics. Miniature hard drives have other disadvantages when compared to Flash memory, such as lower mechanical robustness, higher power consumption, for example about 2 to 4 W, and relatively long access times.

Removable optical storage discs can similarly be used, and offer one large advantage compared to hard disc. The removable optical media is very inexpensive, for example of the order of $0.03 per MB for Minidisc media. However in most other respects optical disc storage compares poorly with magnetic hard discs including relatively poor power consumption, mechanical robustness, bulk, and access performance.

Magnetic tape has even lower media cost than removable optical discs. However it shares other disadvantages of rotating disc storage, particularly with respect to physical bulk, and power consumption. In addition, magnetic tape has the disadvantage of serial access. This presents two additional application problems, namely very slow random access performance and restriction to uniform time compression techniques for storing video or other types of data.

SUMMARY OF THE EMBODIMENTS

According to an embodiment, an addressing circuit for addressing a cross-point memory array is provided. The addressing circuit includes first and second sets of address lines and pull-up and pull-down circuit elements. A first set of cross-point resistive elements are connected to the first set of address lines, and a second set of cross-point resistive elements are connected to the second set of address lines. Also, the pull-up and pull-down circuit elements are comprised of cross-point resistive elements.

According to another embodiment, a memory circuit includes a cross-point memory array having first and second sets of transverse electrodes with respective memory elements formed at the crossing-points of the first and second set electrodes. Each memory element includes a cross-point resistive element. An addressing circuit for addressing the memory array also includes cross-point resistive elements.

According to yet another embodiment, a method for determining the state of a memory element of a plurality of memory elements in a cross-point memory array includes addressing the memory element by applying predetermined electrical signals to a first set of address lines; generating a current using at least one of a pull-up cross-point resistive element; and sensing a binary state of the memory element based on the generated current and using at least one sense line connected to at least one of the pull-up cross-point resistive element and the pull-down cross-point resistive element and further connected to the memory element.

According to yet another embodiment, an apparatus includes means for addressing a memory element; means for generating a current using at least one of a pull-up cross-point resistive element and a pull-down cross-point resistive element; and means for sensing a binary state of the memory element.

BRIEF DESCRIPTION OF THE DRAWINGS

Various features of the embodiments can be more fully appreciated, as the same become better understood with reference to the following detailed description of the embodiments when considered in connection with the accompanying figures, in which.

DETAILED DESCRIPTION OF EMBODIMENTS

Figure 1:
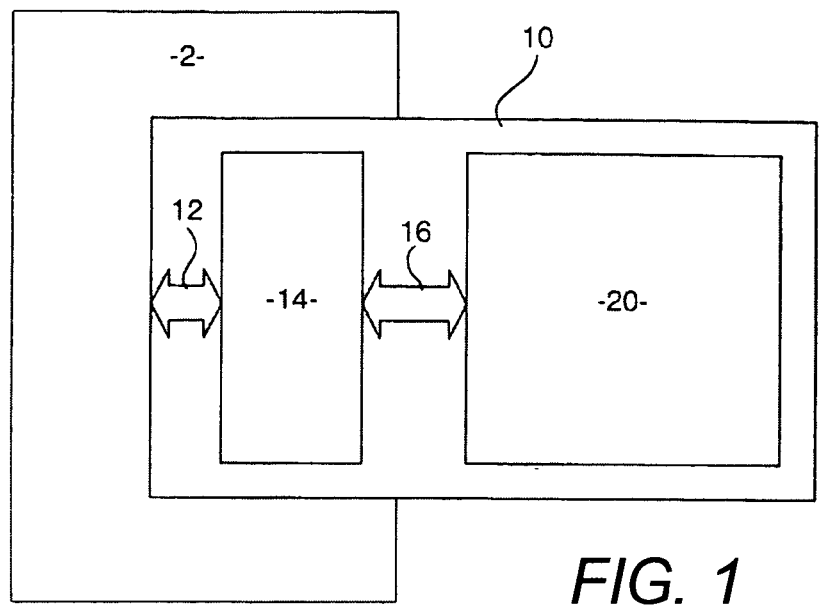
FIG. 1 is a block diagram of a write-once memory system.

For simplicity and illustrative purposes, the principles of the present invention are described by referring mainly to exemplary embodiments thereof. However, one of ordinary skill in the art would readily recognize that variations are possible without departing from the true spirit and scope of the embodiments of the invention. Moreover, in the following detailed description, references are made to the accompanying figures, which illustrate specific embodiments. Electrical, mechanical, logical and structural changes may be made to the embodiments without departing from the spirit and scope of the embodiments. The following detailed description is, therefore, not to be taken in a limiting sense and the scope of the embodiments is defined by the appended claims and their equivalents.

A data storage device is provided that includes a cross-point memory array formed on a dielectric substrate material. The cross-point memory array comprises first and second sets of transverse electrodes separated by a storage layer including at least one semiconductor layer. The storage layer forms a non-volatile memory element at each crossing point of electrodes from the first and second sets. The storage layer may comprise traditional semiconductor materials as well as recently developed organic electronic materials that use relatively inexpensive printing technologies in lieu of semiconductor lithography.

Each memory element in the memory array can be switched between low and high impedance states, representing respective binary data states, by application of a write signal in the form of a predetermined current density through the memory element. The memory elements may include write-once memory elements, such that they may be switched between states one time. Each memory element includes a diode junction formed in the storage layer, at least while in the low impedance state. A plurality of the data storage devices can be stacked and laminated into a memory module providing inexpensive high capacity data storage. Such a memory module can be employed in an archival data storage system in which the memory module provides a write-once data storage unit receivable in an appliance or interface card.

An addressing circuit is provided on the data storage device for accessing the memory elements in the memory array. In order to simplify interconnections to the memory array, the addressing circuit includes a multiplexed addressing scheme for accessing the memory elements in the memory array. Each memory element is uniquely addressable through addressing lines that are fewer in number than the total number of row and column lines in the memory array.

According to an embodiment of the invention, instead of using pull-up and pull-down resistors in the addressing circuit to pull row address lines to a pull-up voltage +V and to pull column address lines to a pull-down voltage −V, circuit elements made from the same material and same structure as circuit elements used in the memory array are used. As described above, the memory elements of the memory array include transverse electrodes with at least with semiconductor layer provided between the transverse electrodes. This structure is referred to as a cross-point structure and may be used to form resistive circuit element. Instead of using pull-up and pull-down resistors in the addressing circuit, pull-up cross-point resistive elements and pull-down cross-point resistive elements having the same structure and substantially the same materials as the memory elements are used.

The cross-point resistive elements are very compact circuit elements that have a size generally defined by the intersection of the two electrodes. Compared with conventional TaN or NiCr thin film resistor technology, which relies on in-plane conduction, much less area is used by cross-point resistive elements. Less area used by the addressing circuit may result in more area being available for memory.

In addition, by using pull-up and pull-down cross-point resistive elements, the storage device is substantially entirely comprised of cross-point resistive elements. Thus, the fabrication process is simplified and less expensive. For example, using cross-point resistive elements instead of conventional thin-film resistors minimizes use of additional materials or processes over the number required to create and interconnect the crosspoint memory arrays. Thus, the cross-point memory arrays can be manufactured in a fast, inexpensive, roll-to-roll process with self-aligning characteristics. Existing methodologies for fabricating resistors in integrated circuits involve masking, alignment, and often, additional materials. Furthermore, introducing a different material to act as a resistor has the disadvantage of introducing a different temperature coefficient of resistivity for the resistors when compared to the memory array. Generally as the temperature of the storage device varies, the resistance of the circuit elements also changes. However, if different materials are used for the circuit elements, such as the memory elements and the elements of the addressing circuit, the amount of change in the resistance may vary substantially for each type of circuit element. This may result in signaling being compromised when operating at different temperatures because the optimum pull-up and pull-down resistance values depend on the resistance of a memory element in its low impedance state. Because this embodiment uses the same cross-point resistive elements for the addressing circuit and the memory array, changes in the resistance due to temperature fluctuations are the same for all the circuit elements and more stable signaling is provided. Also, if there are run-to-run variations in material properties for roll-to-roll processing, these variations are the same for all the circuit elements while they would be different if a different material is used for resistors.

In one example, the cross-point resistive elements used for the memory array and the addressing circuit substantially include diodes, and the embodiments described in detail below generally describe the memory array and the addressing circuit as including diodes having the cross-point structure. It will be apparent to one of ordinary skill in the art that circuit elements, other than diodes, having the cross-point structure may be used in the storage device.

A Write-Once Memory System

FIG. 1 illustrates a write-once memory system employed in a memory card 10. The write-once memory system includes a portable, inexpensive, rugged memory system that is useful for data storage applications, such as digital cameras and portable digital audio devices, etc. The memory system may be incorporated into an industry standard portable interface card (e.g. PCMCIA or CF) so that it can be used in existing and future products with such interfaces. The memory card 10 has an I/O interface connector 12 through which communication is made between the memory card 10 and a device 2 to which it is coupled. The interface connector 12 is coupled to an interface and control circuit 14 which is connected to a removable memory module 20 via an internal interface 16. The memory module 20 provides circuitry for write-once data storage, including some detection, write enabling and addressing functions. The interface and control circuit 14 comprises circuitry for control, interface, detection, error correction coding (ECC) and the like for each removable memory module 20 when it is received in the memory card 10. In one embodiment, the memory card 10 is easily removed from the device 2 by disconnecting the memory card 10 from the device 2 at the connector 12. For example, when the memory card 10 is full, a user removes the memory card 10 from the device 2 and replaces the memory card 10 with another memory card. In another embodiment, the memory module 20 is received in a socket or the like in the memory card 10, so that it may be easily removed there from and replaced with another memory module 20. When received in the memory card 10, the memory module 20 is coupled to the interface and control circuit 14 through the internal interface 16.

Write-once data storage means that, effectively, data can only be written once to the memory and thereafter it remains unchangeable. In many forms of write-once memory it is not strictly true that the data stored therein cannot be changed at all after being initially written, however in general it cannot be changed arbitrarily, as those skilled in the art will appreciate. For example, most write-once memories are fabricated with each memory cell in a first binary state (e.g. representing a binary data "0"), and during a write procedure selected memory cells are changed into a second binary state (e.g. to represent the binary data "1"s). Often the change in the memory from the first binary state to the second is irreversible, such that once a data "1" is written it cannot be changed back to a data "0". This restricts the changes to the stored data that can be made after it has been written to the memory, wherein arbitrary data can only be written once and thereafter data "0"s, for example, can only be changed to data "1" s, and not the other way around.

Since the memory module 20 contains write-once memory, it may be used for archival data storage wherein the data, once stored, is preserved. This is somewhat like a photographic film, where pictures are stored thereon once, and the developed film is kept as a permanent record. Therefore, once the memory module 20 has been filled to capacity with data, another is required for further data storage. It would be possible to simply replace the entire memory card 10 in the device 2, however that would mean the interface and control circuitry 14, as well as the memory card structure, is archived along with the memory module 20. In order to reduce the data storage costs it is desirable that reusable and relatively expensive components of the memory system not be permanently coupled to the actual storage memory, and for that reason the memory module 20 is removable from the memory card 10 in the preferred embodiment. The bulk of the memory card 10 thus involves a one-off cost, and the memory modules 20 for insertion therein are fabricated inexpensively as discussed in further detail below.

A Write-Once Memory Module

Figure 2:
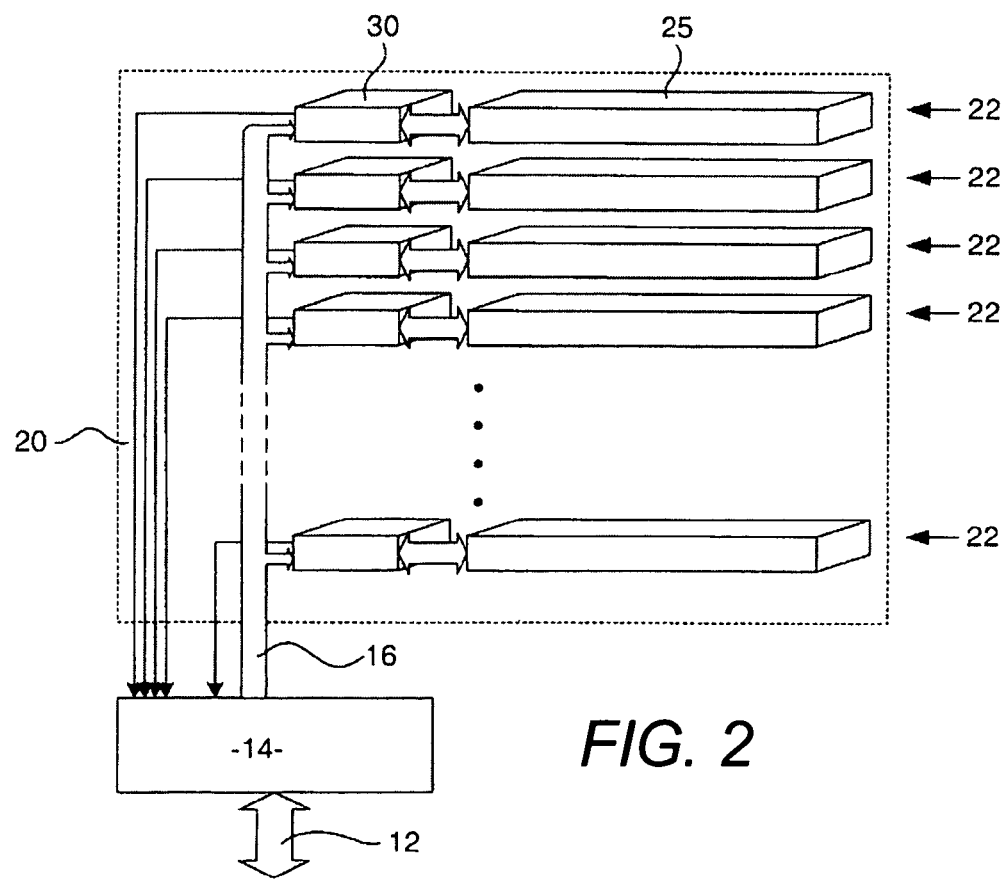
FIG. 2 is a schematic block diagram of the write-once memory system illustrating the general structure of a memory module.

A block representation of the memory module 20 is shown in FIG. 2. In order in increase storage capacity of the memory module 20 for a given base area, the memory module 20 is constructed from a stack of laminated layers 22. Each layer 22 has an array 25 of memory elements that provide the data storage. The layers 22 also each include addressing circuitry 30 coupling the respective memory arrays 25 through the memory system internal interface 16 to the interface and control circuit 14. The addressing circuitry 30 on each layer 22 enables fewer interconnecting conductors between the layers 22 of the memory module 20, which facilitates ease of fabrication and thus lowered costs.

Figure 3:
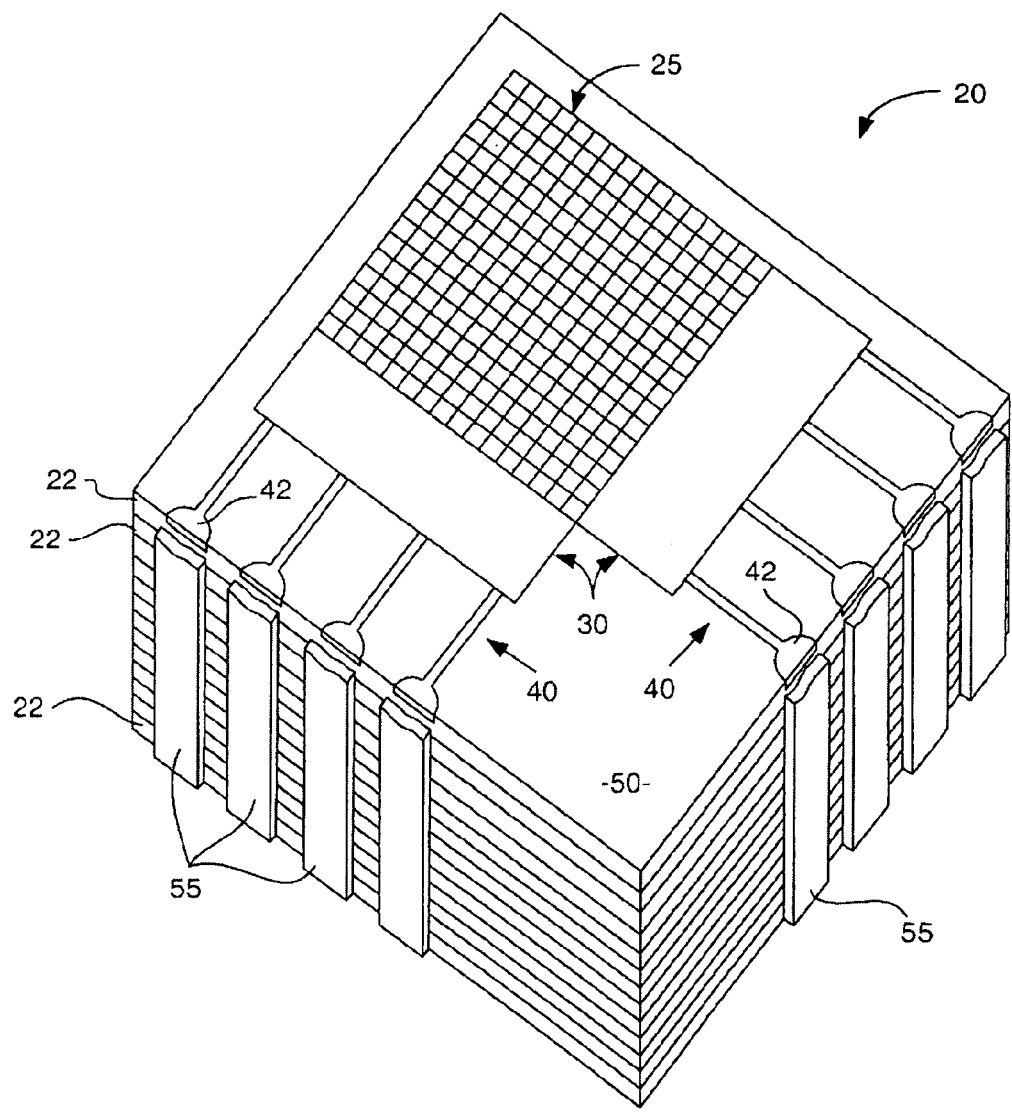
FIG. 3 is a cut-away isometric view of a write-once memory module.

FIG. 3 is a cut-away isometric view of the memory module 20 illustrating a possible physical arrangement of circuits and layers in the memory module 20. Each of the layers 22 comprises a memory array 25 and addressing circuits 30 formed on a substrate 50. The memory array 25 comprises a matrix of memory elements 26, shown in FIG. 4. The addressing circuits 30 comprise column and row multiplexing (mux) circuit portions that are shown positioned adjacent respective orthogonal edges of the memory array 25. Input/output (I/O) leads 40 are also formed on the substrate 50 during the fabrication process. In the memory module 20, row I/O leads of the leads 40 extend from the row mux circuit to a first adjacent edge of the substrate 50, and column I/O leads of the leads 40 extend from the column mux circuit to a second adjacent edge of the substrate 50. Each of the leads 40 terminate at respective contact pads 42, portions of which are exposed at the edges of the substrate 50.

A plurality of layers 22 are stacked in the same orientation and laminated together. Electrical contact is made to the exposed portions of the contact pads 42 of the stacked layers 22 by conductive contact elements 55, which are illustrated in partial cut-away view in FIG. 3. The contact elements 55 extend along the sides of the memory module 20, transverse to the plane of the individual layers 22. Each contact element 55 as illustrated makes electrical contact to a respective contact pads of a plurality of the layers 22 in the stack. The contact elements 55 can be used to couple the memory module 20 through the memory system internal interface 16 to the interface and control circuit 14.

In one implementation of the memory module 20 the substrate 50 for each of the layers 22 may be formed from a polymer plastics material. The processes by which the integrated circuits (e.g. memory array 25 and addressing circuits 30) can be formed on the substrate 50, and the layers 22 assembled into the memory module 20 are described in detail in the specification of U.S. Pat. No. 6,646,912, entitled "Non-Volatile Memory" and hereby incorporated by reference in its entirety.

A Write-Once Memory Array

Figure 4:
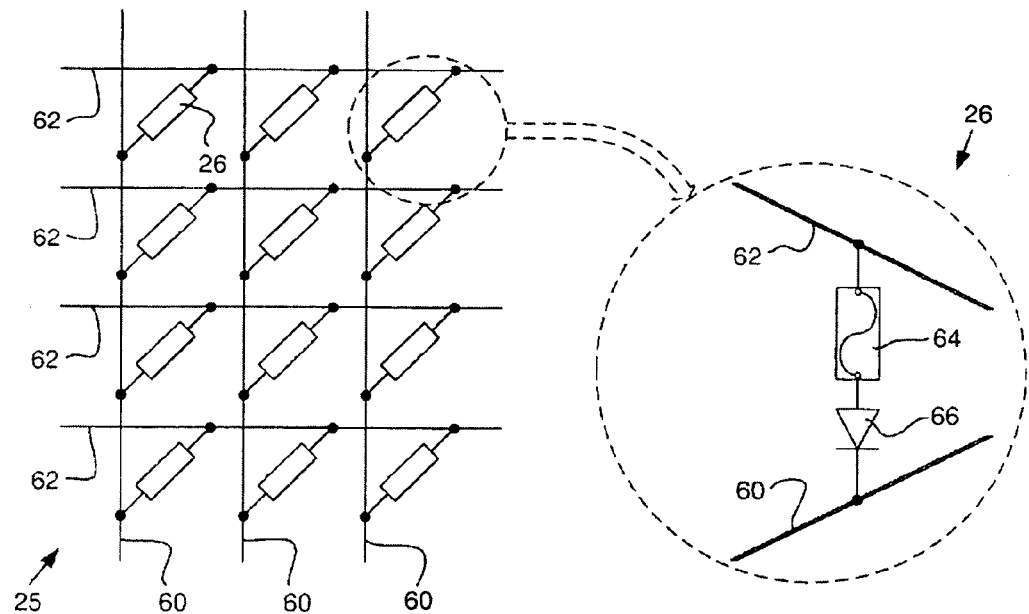
FIG. 4 is a pictorial diagram of a cross-point memory element.

An array 25 of memory elements 26 is formed on each of the layers in the memory module 20. The memory array 25 comprises a regular matrix of column lines and row lines with a memory element at each column/row intersection. FIG. 4 illustrates a schematic diagram of a portion of the memory array 25 having column lines 60 and row lines 62, according to an embodiment. Coupled between each of the column lines and row lines is a memory element 26, which is also shown in greater detail in an expanded portion of the diagram in FIG. 4. Each memory element 26 comprises a fuse element 64 coupled in series with a diode element 66. The fuse element 64 provides the actual data storage effect of the memory element 26, and the diode 66 facilitates addressing of the memory element 26 using the row and column lines for writing and reading data.

It will be appreciated that, although the above description refers to fuse elements in the memory array that are fabricated in a low resistance state and blown to create a high resistance state, it is equally possible to create a memory array using "anti-fuse" elements that operate in the opposite manner. In that case, the memory elements are fabricated in a high resistance state, and blown to create a low resistance. The anti-fuse in each memory element is also formed in series with a diode for the reasons mentioned above. The diode and anti-fuse are separate in this case, since the diode function is required after the anti-fuse has been blown.

Use of the memory array 25 is as follows. At fabrication, each of the memory elements 26 has a fuse element 64 that is conductive. The conductive state (also referred to as the low impedance state) of the fuse element 64 represents one binary data state, say a data "0". In order to write data to the memory array 25, each memory element 26 in which it is desired to store a data "1" is addressed using the column and row lines and the fuse element 64 for each memory element 23 having a data "1" written therein is "blown", placing those memory elements 23 in a non-conductive state (also referred to as a high impedance state). The non-conductive state of the fuse element 64 represents the binary data state, such as a data "1". Blowing the fuse element is a one-way operation, which makes the memory a "write-once" storage, as discussed hereinabove. A data writing operation (e.g. writing a data "1" to a selected memory element 26) can be performed by applying a predetermined current through a selected row line to a selected column line, for example, sufficient to blow the fuse 64 of the selected memory element 26 that directly interconnects those row/column lines. Data can be read from the memory array 25 by addressing memory elements 26 using the column and row lines and sensing which memory elements 26 are conductive (data "0"s) and which are non-conductive (data "1"s).

The diode element 66 in each memory element 26 of the memory array 25 assists in addressing the memory elements 26 uniquely using the column and row lines for writing and reading data. Without a diode element 66 in the row/column cross-point memory elements 26 there are current paths through many memory elements 26 between a given column line and row line. However, with the diode element 66 forming a one-way conduction path through each memory element 26, a single column line and single row line can be used to uniquely address a single memory element 26. In other words, forming a circuit from one row line to one column line permits current to pass through only a single memory element 26. By applying a predetermined "data writing" current through that circuit, the fuse 64 in the memory element 26 can be blown to change a data "0" to a data "1". Also, by sensing the resistance in the circuit it is possible to determine whether the fuse 64 is blown or intact, thereby reading a data "1" or data "0".

Thus, the diodes 66 reduce the incidence of cross-talk between the memory elements 26 in the memory array 25 during reading and writing operations. Furthermore, the non-linear current-voltage (I-V) characteristics of the diodes 66 improve the data sensing signal-to-noise ratio (SNR), which assists in remote sensing and diode based addressing. The data in the memory module 20 is sensed remotely since the sensing circuitry is in the interface and control circuit 14, which is contained in a separate integrated circuit. Also, permuted diode logic addressing of the memory elements 26 is employed, using the addressing circuits as described below, in order to reduce the number of connections required between the memory module 20 and the interface and control circuit 14.

Figure 5:
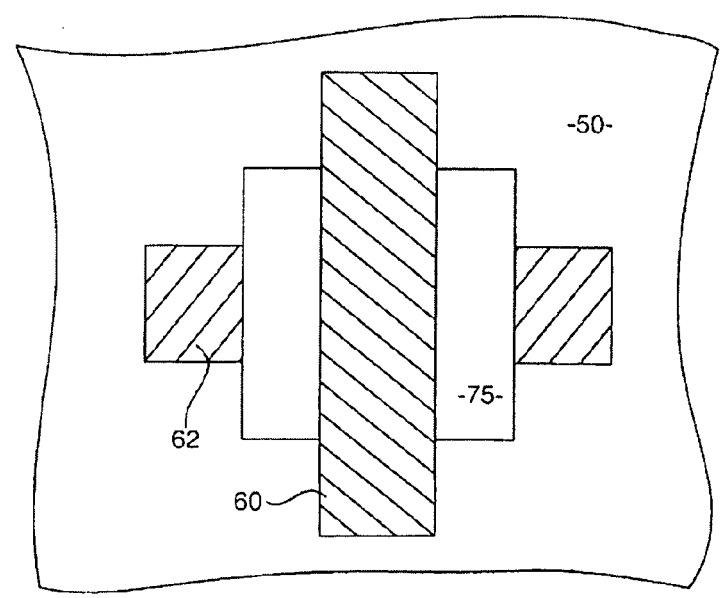
FIG. 5 is a simplified plan view of a cross-point memory element.

FIG. 5 generally represents the structure of a cross-point resistive element, which may be used in the memory array 25 or the addressing circuits 30 shown in FIGS. 3 and 4. The basic structure comprises two layers of orthogonal sets of spaced parallel conductors 60 and 62 arranged with at least one semiconductor layer 75 therebetween. The two set of conductors 60 and 62 form row and column electrodes overlaid in such a manner that each of the row electrodes intersects each of the column electrodes at exactly one place. At each of these intersections a connection is made between the row electrode (e.g., conductor 62) and column electrode (e.g., conductor 60) through the semiconductor layer 75. Although commonly in this description the semiconductor layer 75 is referred to in the singular, in practice a plurality of layers of different materials may be employed. The layers may include materials that are not semiconductors, such as metals and even dielectrics in various configurations.

The structure may be used to form the memory elements 26 provided in the cross-point memory array 25 shown in FIG. 4. The semiconductor layer 75 may include thin films for generating the fuse 64 in series with the diode 66, shown in FIG. 4, for a memory element 26. The diodes 66 in the array 25 are all oriented so that if a common potential is applied between all the row electrodes and all the column electrodes then all the diodes 66 are biased in the same direction. The fuse 64 may be realized as a separate element from the diode 66 which will open circuit when a critical current is passed therethrough or it may be incorporated in the behavior of the diode.

A characteristic of the fuse 64 is that its resistance changes between a high impedance state and a low impedance state irreversibly or the reverse at some critical current threshold. The change in resistance between the states is substantial. The critical current of the fuse 64 may be controlled by the area of the devices, such as the area of the intersection of the row and column conductors 60 and 62 shown in FIG. 5. The area of the device may also be lithographically defined. The fuse 64 and diode 66 can be formed from a number of thin films, for example provided in the semiconductor layer 75, deposited in series between the row and column electrodes 60 and 62. The individual memory elements 26 occur at the intersection of the row and column electrodes 60 and 62 as described above. Although the fuse and diode layers are deposited as contiguous films covering the entire area of the intersection, they may be patterned by a number of means (laser ablation, photolithography, soft lithography) to minimize cross talk between individual devices.

The structure shown in FIG. 5 may also be used to form cross-point resistive elements, such as diodes, used in the addressing circuits 30 shown in FIG. 3. For these diodes, the semiconductor layer 75 may include one or more thin films for forming only a diode, instead of a diode in series with a fuse such as shown for the memory element 26. The addressing circuits 30 are described in further detail with respect to FIG. 7. Furthermore, the same layers may be shared by the cross-point resistive elements in the addressing circuits 30 and the memory elements 26. For the addressing circuits 30, a first shared conductive layer may include column electrodes (e.g., the column electrode 60) and a second shared conductive layer may include row electrodes (e.g., the row electrode 62). The semiconductor layer 75 may also be shared by the cross-point resistive elements in the addressing circuits 30. These conductive layers and the semiconductor layer 75 may also be shared by the memory elements 26.

Figure 6:
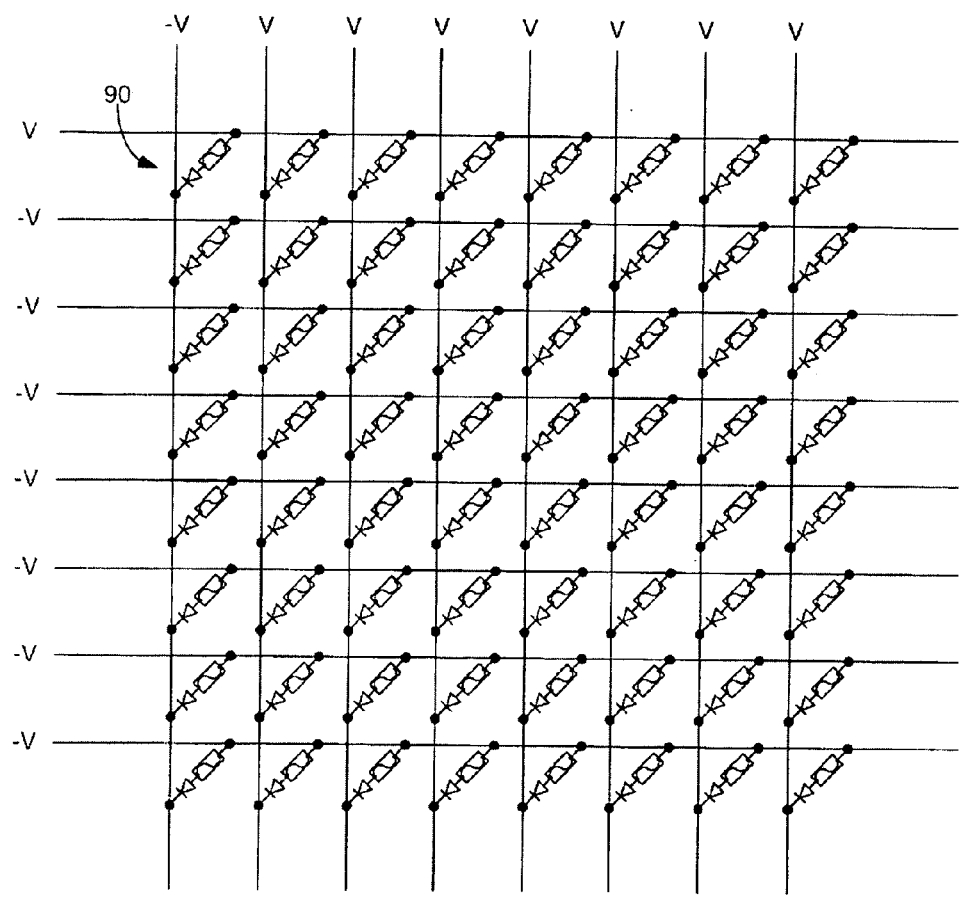
FIG. 6 shows a write-once memory array.

FIG. 6 is a schematic representation of a cross-point write-once diode memory array. FIG. 6 shows an eight row by eight column array. If voltages are applied to the row and column electrodes, such as the row and column conductors 60 and 62 shown in FIGS. 4 and 5, as depicted (i.e. all the column electrodes are a potential V except for one which is at −V, and all the row electrodes are at −V except for one which is at V), then only one diode will be forward biased. For the case depicted in FIG. 6 only the diode 90 in the upper left corner of the array will be forward biased. The rest of the diodes in the top row and left-most column have no bias on them and the remaining diodes in the array are reverse biased. This constitutes an addressing scheme for the array. If a current flows between the rows and columns with the electrodes at these potentials, then the fuse of the upper left diode is intact (e.g. representing a data "0"). Conversely, if no current flows in this configuration then the corresponding diode/fuse has been blown (e.g. representing a data "1"). By modulating the amplitudes of the voltages applied to the array electrodes more current can be made to flow through the selected diode. If this voltage causes a current that exceeds the threshold current of the fuse then the fuse can be blown, changing the state of the memory element. This constitutes a method for writing to the memory array.

The actual current required to blow a fuse in the memory array (or the voltage to be applied to achieve that current) can be predicted and controlled at the time of fabrication. Since it is current density through the memory elements that is the operative factor, the applied voltage/current at which an element blows can be adjusted by varying the junction area of the element. For example, if the cross-sectional area of the intersection of the cross-point electrodes is reduced this also reduces the current/voltage required to be applied to reach the critical current density to blow a fuse 64 of a memory element 26. This scheme can be used in the design and fabrication of the memory circuits to ensure that control voltages can be applied to blow only the desired cross-point fuses.

Memory Array Addressing Circuitry

In order to simplify interconnections to the memory array 25 a multiplexed addressing scheme for accessing the memory elements 26 in the memory array 25 may be used. Each memory element 26 in the memory array 25 is uniquely addressable from an external circuit through addressing lines that are fewer in number than the total number of the row and column conductors 60 and 62 shown in FIGS. 4 and 5 forming the memory array 25. To that end, addressing circuitry, such as the addressing circuits 30 shown in FIG. 3, is included on the same substrate 50 as the memory array 25.

The addressing circuitry, according to an embodiment, is sometimes referred to herein as performing a multiplexing (mux) and/or de-multiplexing (demux) function. In the context of this specification the term "multiplexing" is understood to encompass the form of permuted diode logic addressing utilized in the preferred embodiment, even though the selection scheme is somewhat different from traditional multiplexing arrangements.

Figure 7:
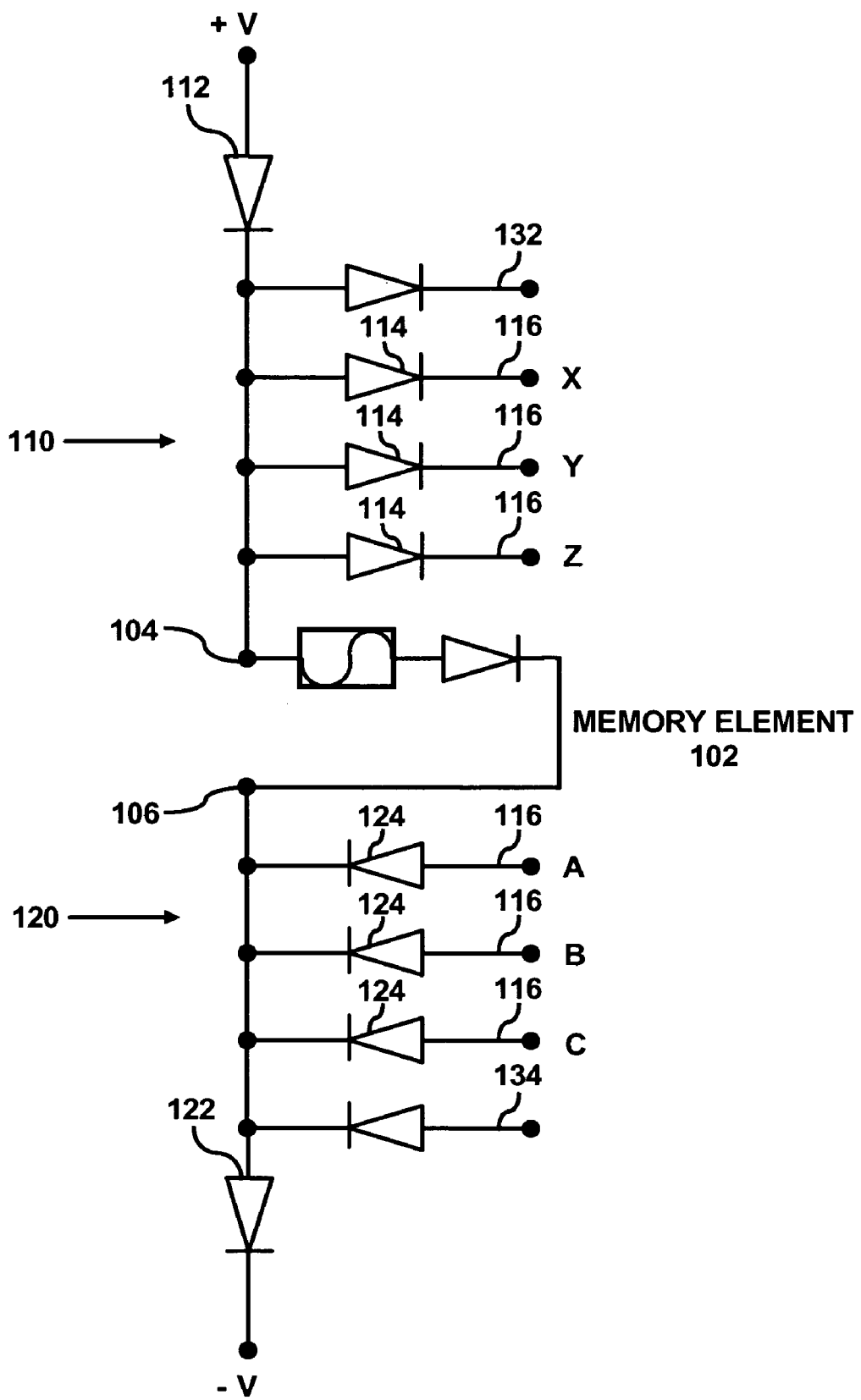
FIG. 7 is a schematic circuit diagram of a portion of a memory array addressing circuit.

The address mux/demux functions are carried out using a logic scheme referred to as permuted diode logic, which is described hereinbelow. FIG. 7 illustrates a single write-once memory element 102 represented by a fuse and diode in series, which is the same as the memory element 26 including the fuse 64 and the diode 66 in series and coupled between the row and column electrodes 60 and 62 such as shown in FIG. 4. The memory element 102 is coupled between a row electrode 104 and a column electrode 106. A row address diode logic circuit 110 is coupled to the row electrode 104, and a column address diode logic circuit 120 is coupled to the column electrode 106.

The row address circuit 110 comprises a pull-up cross-point resistive element 112 coupled between the row electrode 104 and a pull-up voltage +V. An example of the pull-up cross-point resistive element 112 may include a diode, such as shown in FIG. 7 and referred to as pull-up diode 112. The row address circuit 110 also comprises plurality of row address lines 116 coupled to the row electrode 104. The row address lines 116 include row address diodes 114 having anodes coupled to the row electrode 104 and cathodes controlled by respective row address input voltages represented by X, Y and Z.

A column address circuit 120 is similarly constructed with a pull-down cross-point resistive element 122 coupled from the column electrode 106 to a pull-down voltage −V. An example of the pull-down cross-point resistive element 122 may include a diode, such as shown in FIG. 7 and referred to as pull-down diode 122. The column address circuit 120 includes a plurality of column address lines 126 coupled to the column electrode 106. The column address lines 126 include column address diodes 124 having their cathodes coupled to the column electrode 106, and anodes controlled by respective column address input voltages represented by A, B and C.

Consider firstly the row address circuit 110 in which logic levels of +V and −(V+ΔV) are used for the row address input voltages (X, Y, Z). It will be apparent that, where voltage +V represents a logic "1", the row address circuit 110 acts like an AND gate with the diode cathodes (X, Y, Z) as inputs and the row electrode 104 as output. The row electrode 104 is high (+V) only if all three row address inputs (X, Y, Z) are high. Similarly, the column address circuit 120 acts like a negative logic AND gate. In this case, if logic levels of −V and (V+ΔV) are applied at the column address inputs (A, B, C), the output at the column electrode 106 will only be −V when all three inputs are at −V. If the row address inputs (X, Y, Z) all apply cathode voltages of +V to the diodes 114 and the column address inputs (A, B, C) all apply anode voltages of −V to the diodes 124 then the memory element 102 is selected. Although in FIG. 7 only three-input circuits are illustrated, this addressing scheme can be extended to include an arbitrary number of inputs.

There are $n^d$ permutations when one item is selected from each of d groups of n nodes. Therefore, $n^d$ electrodes can be connected through diodes to one out of n nodes in each of d groups. If a high logic level is applied to exactly one node in each group then only one electrode will be selected, since all lines connected to an electrode must be high to select it and no two electrodes share the identical connections.

As described above, the row address circuit 110 and the column address circuit 120 may use pull-up and pull-down diodes 112 and 122, respectively, instead of pull-up and pull-down resistors. The pull-up and pull-down diodes 112 and 122 may include the same structure and substantially the same materials as the memory element 102. For example, the pull-up and pull-down diodes 112 and 122 and the memory element 102 include cross-point resistive elements having the structure shown in FIG. 5. Also, the same materials may be used, except the memory element 102 may also include materials for the fuse. Thus, fabrication of the memory module including the memory array 25 and the addressing circuits 30 is simplified and less expensive. Furthermore, introducing a different material to act as a resistor has the disadvantage of introducing a different temperature coefficient of resistivity for the resistors when compared to the other circuit elements in the memory module. Generally as the temperature of the memory module varies, the resistance of the circuit elements also changes. However, if different materials are used for the circuit elements, such as the memory elements and the elements of the addressing circuit, the amount of change in the resistance may vary substantially for each type of circuit element. This may result in signaling (e.g., detecting the binary state of a memory element) being compromised when operating at different temperatures because the optimum pull-up and pull-down resistance values depend on the resistance of a memory element in its low impedance state. Because this embodiment uses the same cross-point resistive elements for the addressing circuit and the memory array, changes in temperature are the same for all the circuit elements and more stable signaling is provided.

Signaling may include reading and writing to the memory element 102. Signaling may be performed using the row sense line 132 and/or the column sense line 134, both including cross-point resistive elements such as diodes. The state of an addressed memory element is determined by the current which flows through the sense lines to a suitably chosen bias point. In order for current to pass through either a sense line two conditions must be met: (1) the diode memory element must be addressed, and (2) the fuse of that element must be blown. In all other cases the diode is not addressed and, regardless of the state of the fuse, the corresponding row and/or column sense diode will not be forward biased and will not conduct current. Therefore, if a single sense line is connected to all the row (or column) electrodes and one memory element in the row and column array is addressed, then the state of that memory element can be unambiguously determined.

Referring to the example shown in FIG. 7, if the memory element 102 is addressed using the row and column address lines 116 and 126, the binary state of the memory element 102 may be determined using one or more of the sense lines 132 and 134. For example, a voltage is applied across the pull-up diode 112, generating a current. If the fuse in the memory element 102 is blown (e.g., the fuse is in a high impedance state representing a "1"), the current substantially flows through the row sense line 132. The current sensed in the row sense line 132 indicates that the memory element 102 is in a high impedance state. If the memory element 102 is in a low impedance state (e.g., representing a "0"), the current substantially flows through the memory element 102 instead of the row sense line 102. Thus, the diode in the row sense line 132 would not be biased, indicating the memory element 102 is in a low impedance state. The column sense line 134 functions in a similar manner.

The current generated across the pull-up diode 112 and the pull-down diode 122 is proportional to the resistance of these diodes. Thus, the resistance of the pull-up diode 112 and the pull-down diode 122 may be selected to provide the largest detection signal for detecting the binary state of the memory element 102. The detection signal is the difference in current that flows through the cross-point resistive elements, such as the diodes in the sense lines 132 and 134, when the memory element 102 changes between its low and high impedance states. Assuming that the high impedance state of the memory element is much larger than the low impedance state, the detection signal is maximized when the pull-up diode 112 (or pull-down diode 122) has a resistance approximately equal to Rlow, where Rlow is the resistance of the memory element 102 in the low impedance state. However, the resistance of the pull-up diode 112 (or pull-down diode 122) may be in the range of 0.1×Rlow to 10×Rlow. Factors such as power consumption, RC time constants and maximizing the detection signal may be considered when selecting the resistance of the pull-up diode 112 and the pull-down diode 122.

Figure 8:
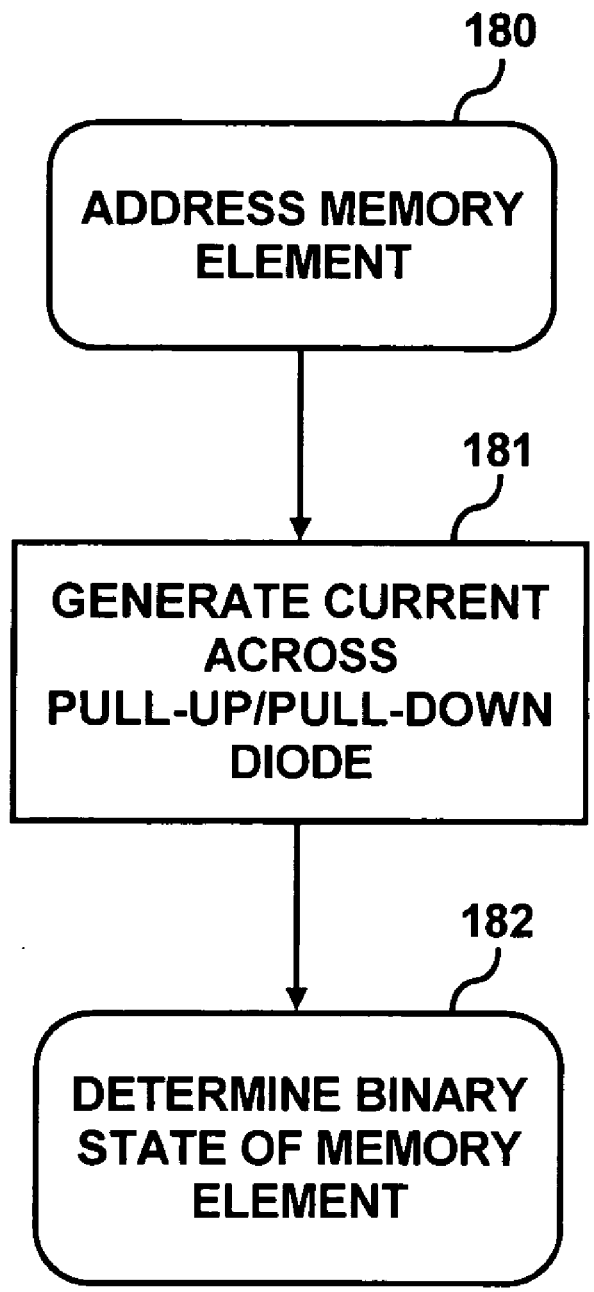
FIG. 8 is a flow chart of a method for addressing a memory element in a cross-point memory array.

FIG. 8 illustrates a method for addressing the memory element 102, according to an embodiment. At step 180, the memory element 102 is addressed by applying predetermined electrical signals (e.g., predetermined voltages) to the row address lines 116 and the column address lines 126. At step 181 a current is generated across the pull-up diode 112 and/or the pull-down diode 122. At step 182 the binary state of the memory element 102 is determined using the sense line 132 and/or the sense line 134. For example, if the memory element 102 is in a high impedance state, a current is detected in the sense line 132. If the memory element 102 is in a low impedance state, substantially no current is detected in the sense line 132.

The sense lines 132 and 134 may also be used to enable or prevent writing to the addressed memory element 102. As shown in FIG. 3, the memory module may include multiple layers, each including a memory array and addressing circuits. A predetermined electrical signal may be applied to a sense line on a particular layer to enable or inhibit writing to an addressed memory element. For example, referring to FIG. 7, a high voltage may be applied to the sense line 132 to enable writing to the memory element 102 and a low voltage may be applied to the sense line 132 to inhibit writing to the memory element 102.

Addressing Over Multiple Memory Module Layers

In the memory module, multiple layers may be addressed in parallel. The memory module may comprise a stack of multiple layers. Each layer includes a write-once memory array, such as the memory array 25, wherein the memory arrays of the various layers share common addressing lines so as to reduce the number of connections required to external circuitry. For example if a memory module consists of M layers each containing an array with N memory elements, N row electrodes and N column electrodes, then when the ith row and jth column are addressed on one layer they are addressed on all layers. This is desirable for two reasons. First, by being able to read M layers in parallel the read and write rates required to achieve a given serial bit rate are divided by M. Secondly, if separate address lines are required for each layer of the memory then the number of connections from layer to layer and from the memory module to the interface and control circuitry becomes unmanageable.

Sense lines, such as the row and column sense lines 132 and 134 shown in FIG. 7, are used to select a layer for parallel addressing. The binary state of an addressed memory element can be detected using either a row sense diode, a column sense diode, or both the sense lines. Furthermore, the binary state of an addressed memory element is determined by the current which flows through the sense line to a suitably chosen bias point, such as described above with respect to FIG. 7.

The use of row and column sense lines provides redundancy without compromising the speed of the readout process and thereby improving the signal detection margin. Note that redundancy can also be added by including additional sense lines to either the row or column electrodes and/or by adding extra diodes in parallel to the connection between the sense lines and the row or column electrodes.

Figure 9:
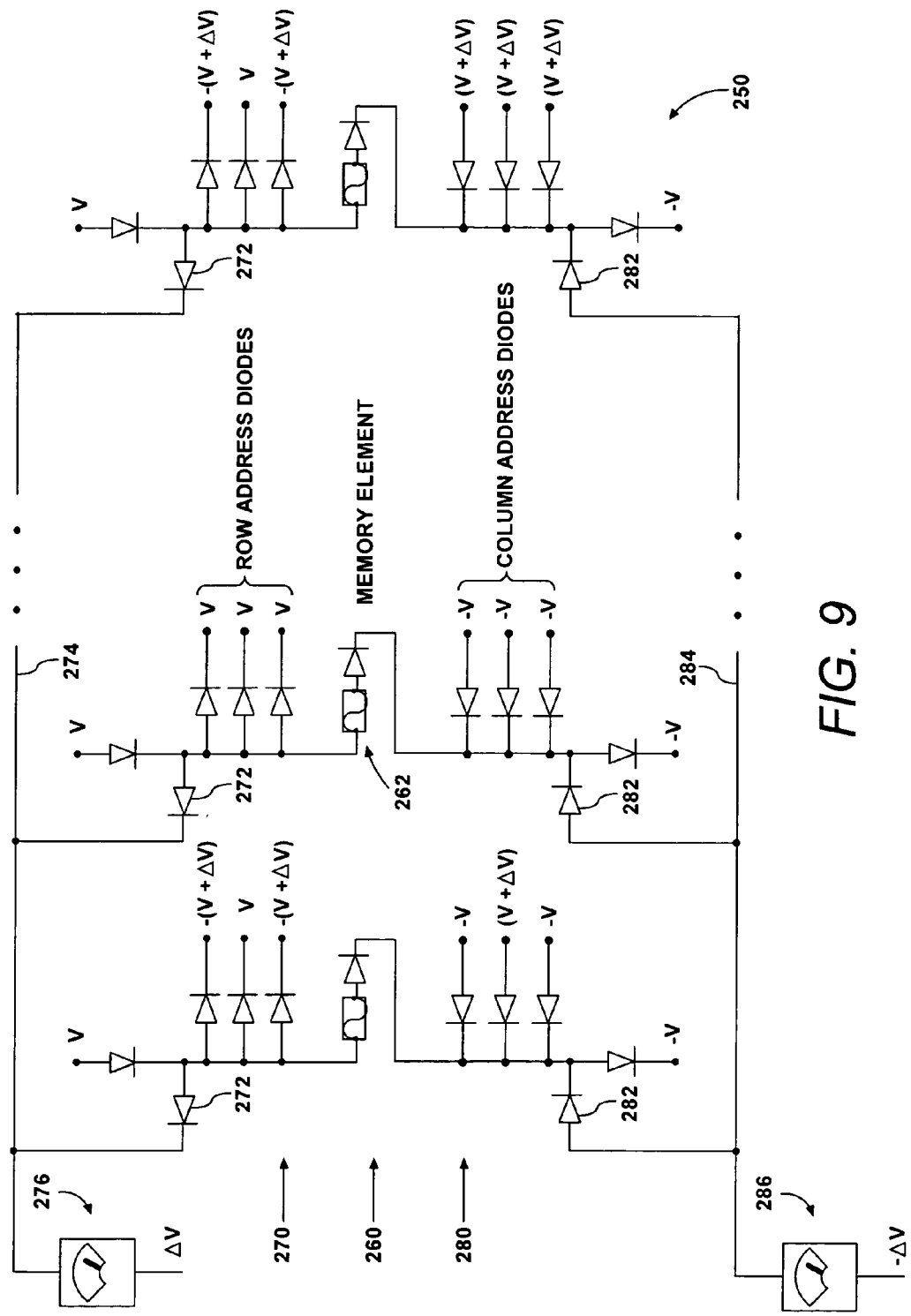
FIG. 9 is a schematic circuit diagram of a memory element sensing circuit.

FIG. 9 shows a schematic diagram of addressing and sensing circuitry 250 utilizing the techniques described above with respect to FIG. 7. A plurality of memory elements 260 in a write-once memory array are shown. The memory elements 260 are coupled to their respective row and column addressing circuits 270, 280 which are constructed to address the memory array. The circuitry 250 also includes a common row sense line 274 and a common column sense line 284. The common row sense line 274 is coupled to each of the memory array row electrodes through respective row sense diodes 272. In particular, each diode 272 has its anode coupled to the corresponding row electrode and its cathode coupled to the common row sense line. Similarly, column sense diodes 282 are coupled from the common column sense line 284 to the respective column electrodes of the memory array. The cathodes of diodes 282 are coupled to the respective column electrodes, and the anodes thereof coupled to the common column sense line.

In the example as shown the center memory element 262 is addressed. This is because memory element 262 is coupled to both the row and column electrodes that are selected by the addressing circuits. As shown in FIG. 9, the memory element 262 corresponds to the addressing circuits in which none of its row or column address diodes are in conduction due to the voltages applied thereto. If the fuse of the memory element 262 is blown then current flows through both sense diodes 272, 282 in the row and column sense lines 274 and 284. If the fuse is not blown, then no current flows in either sense line 274 and 284 regardless of the state of the fuses in any other memory elements in the array. In that case no current flows through the sense diodes corresponding to the addressed memory element, and all other memory elements are unselected since the addressing scheme ensures that at least one of the address diodes is in conduction thereby guaranteeing that the corresponding sense diode will be reverse biased.

If more than one row or column electrode in the array is addressed then the state of the memory elements at the intersections of all the addressed lines may still be determined provided that at least one end of each memory element can be connected to a sense line which is separate from the others. This configuration results in reduced detection margins. For example consider two addressed rows and one addressed column. If all the addressed fuses are intact then the sense diodes appear to be connected through two resistors in parallel to one of the power supply rails and through only one resistor to the other power supply rail. In order to be able to detect this condition the bias applied to the termination of the sense lines should be adjusted closer to one of the supply rail voltages, resulting in lower currents (smaller signals) when detecting the blown fuse condition. This is not a problem when each addressed row/column intersects at most one other addressed column/row as in the case when multiple cross-point arrays share the same address lines, but have their own sense lines, and in the case of a stack of cross-point memories or when multiple non-interconnected cross-point arrays exist on a single substrate.

Figure 10:
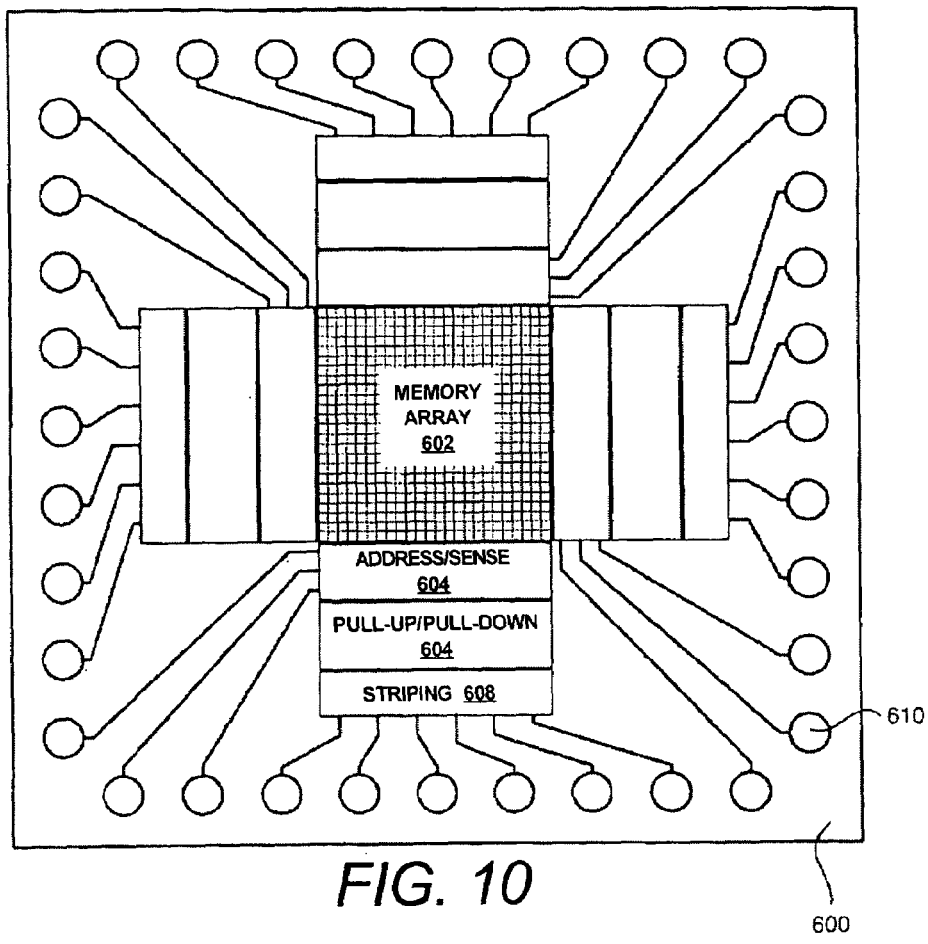
FIG. 10 is a simplified block architectural layout diagram of a memory module layer.

FIG. 10 illustrates a block architectural layout of a memory module layer 600 indicating an example of the relative positioning of the circuit elements. The memory array 602 is positioned centrally, and at the periphery thereof are positioned address/sense lines 604, pull-up/pull-down diodes 606 and power supply striping couplings 608. Around the periphery of these circuits are located contact pads 610 for making external interconnections. It will be appreciated from the foregoing description that the physical architecture of the layer 600 is particularly simple, with the row/column electrodes extending out from the array through the address/sense circuits, pull-up and pull-down diodes and striping connections to the interconnect contact pads. The address and sense lines are similarly arranged, and all of the diode circuit elements are automatically formed at the conductor cross-points (i.e., all of the diodes are cross-point resistive elements having the cross-point structure and including the same materials).

Figure 11:
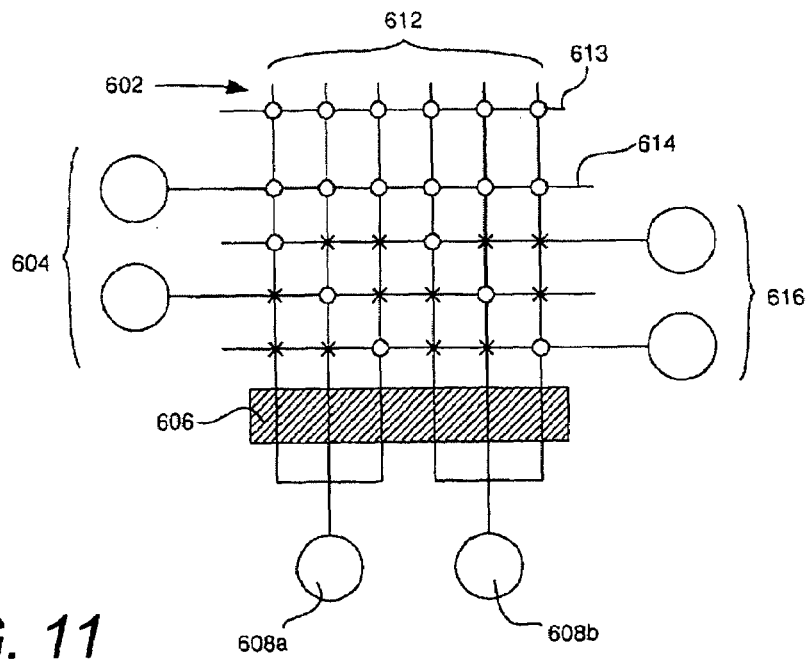
FIG. 11 is a diagrammatic layout view of a portion of memory array and addressing/sensing circuitry.

A portion of the memory module layer 600 is shown in greater detail in FIG. 11. Here, a portion of a memory array 602 is shown with column electrodes 612 and row electrode 613. The column electrodes 612 are crossed by a column sense line 614 and column address lines 616, forming the address/sense circuits 604. Pull-up/pull-down diodes are formed in the column electrodes at 606. The column electrodes 612 are arranged into stripes, wherein groups of electrodes are coupled to separate power supply terminals 608a, 608b. The row electrodes (not shown) are similarly arranged. The power supply striping connections can be used as part of the addressing scheme as well as a mechanism to reduce leakage currents, by applying power to, and thereby selecting, only one portion (sub-array) of the memory array at a time.

Assuming that the address and power supply lines are bussed (common) to all of the layers in a memory module, writing data can be performed by addressing a bit on each layer and strobing the power supply in the active sub-array (determined by the power supply striping) from a read level to a write level. However, writing different data states to different layers is achieved using the sense lines to pull down the voltage on layers where the memory element diode/fuse is to be protected. This means that the sense diodes in the sense lines withstand a current that would blow the memory array elements.

Accordingly, the sense diodes are more robust diodes fabricated with wider voltage/current tolerances. Pull-up and pull-down diodes are also fabricated with wider voltage/current tolerances, for example, to withstand a current that would blow the memory array elements.

Another possible usage of redundant sense lines is to check the function of the memory before it is written. Information maybe gathered from inconsistent measurements from various sense lines in combination with various states of the power supply connections to the row and column electrode ends to reveal defective memory elements and/or defective addressing. This information maybe used to generate sparing tables that can be used to avoid writing to defective areas of the memory module and thereby improve the product tolerance to processing yields.

Integrated Circuit Structure

The memory array and addressing circuitry can be formed, for example, according to a metal-semiconductor-metal (MSM) process on the plastic substrate 50. The MSM process results in two patterned layers of conductive metal circuits with one or more layers of semiconductor material therebetween. Where the metal layers cross and make contact to opposed sides of the semiconductor layer, a diode junction is formed between the metal layers. The production of MSM diode integrated circuits is described, for example, in the specification of International Patent Application Publication Number WO 99/39394, entitled "X-Y Addressable Electric Microswitch Arrays and Sensor Matrices Employing Them". The disclosure of that document is explicitly incorporated herein by reference.

General Considerations

The memory system described herein has several features that make it particularly suitable for portable data storage applications such as in digital cameras (still picture and/or video), digital music players/recorders (e.g. MP3 players), personal digital assistants (PDAs), mobile telephones, etc. The memory system is able to provide data storage in capacities sufficient to be useful such appliances and can be produced at relatively low cost. Data can be written to the memory and thereafter it is permanently stored. Thus, a high capacity storage device (e.g. 100 MB to over 1 GB) can be provided at low cost (e.g. less than about $5) for permanent archival data storage with use in portable appliances.

The data storage is provided by a memory module that is produced at low cost by using inexpensive materials and processing technology. The memory module may be formed from a plurality of layers each having a cross-point memory array and addressing circuitry. Each layer can be formed on an inexpensive flexible substrate, such as polymer or dielectric coated metal film, which is much cheaper than a traditional single crystal silicon substrate and allows for relatively fast and inexpensive fabrication processes to be used. The circuitry formed on each layer, comprising the cross-point memory array and associated addressing circuits, is designed to be simple in structure to enable uncomplicated fabrication processing. In particular, the memory array and addressing circuits are designed according to a permuted diode logic regime which allows both the memory array and addressing circuits to be fabricated using the same simple process.

Each memory module layer has two sets of electrode conductors arranged in respective layers with a semiconductor layer therebetween. The electrodes are arranged in an orthogonal matrix and at the intersection point of each pair of crossing electrodes a memory element is formed in the semiconductor material. The semiconductor layer allows for low temperature processing so as to be compatible with the plastic substrate, and may be an amorphous silicon material or constructed from one or more organic semiconductor materials. Where the electrode layers cross, separated by the semiconductor layer, a rectifying junction is formed between the two electrode conductors. Each rectifying junction can be considered as a diode in series with a fuse element, and such junctions form the basis of the memory array and the diode logic addressing circuits.

The addressing circuitry included on a memory module layer facilitates a reduction in the number of externally accessible addressing lines that are required to read from or write to the memory elements in an array. This facilitates, for example, a manageable number of the interconnections from a layer in the memory module to external circuitry reading and writing, and the like. For example, using the permuted diode logic addressing scheme described a memory array of 100,000,000 bits can be addressed by 56 external addressing lines. Power supply striping can also be used, wherein power is supplied to only a portion of the memory array at a time, which reduces leakage currents in the array and can also form part of the memory array addressing scheme.

Interface and control circuitry is separate from the memory module, constructed for example in the form of a convention integrated circuit or circuits. The interface and control circuitry includes a circuit for generating addressing signals to be applied to the memory module, and a sensing circuit for reading stored data. The sensing scheme is based on electrical current levels rather than electric charge, which allows the sensing circuitry to more easily read data remotely from the memory module. Furthermore, the data storage is based on a large resistance change when a memory element fuse is blown, which provides relatively large sensing signals.

As the data storage in the memory module is separate from the interface and control circuitry, the memory module can be replaced when it has reached storage capacity and another memory module can be used with the same interface and control circuitry. This means that most reusable components of the memory system do not have to be replaced when more data storage is required. Also, the interface and control circuitry can be relatively complex because it is not limited by the memory module fabrication process, and can be relatively expensive since it represents a one time cost in the memory system. This can be exploited by providing sophisticated error detection and correction capability in the interface and control circuitry which allows the memory system to be error tolerant despite remote sensing and able to cope with imperfectly fabricated memory modules thereby increasing the number of useable memory modules from an imperfect fabrication process yield.

The foregoing detailed description of a preferred embodiment of the present invention is presented by way of example only, and many variations to the circuits, structures, arrangements and processes described are possible without departing from the scope of the invention. For example, the memory addressing system of the preferred embodiment is described primarily in the context of a memory module having a plurality of layers of memory circuits, however it will be readily recognized that many other applications are possible.

The structure of the memory module also has many possible variations whilst retaining the principles of the present invention. In the described embodiment a single memory array is fabricated on each layer, and the layers are aligned and stacked in top of one another. Each layer could alternatively include more than one memory array, and the layers could also be stacked in a different way, such as a fan-fold stack. It may also be advantageous in some applications to fabricate multiple circuit layers built up on a single substrate.

What is claimed is:

1. An addressing circuit for addressing a cross-point memory array having first and second sets of address lines, the addressing circuit comprising:
   a first set of cross-point resistive elements connected to the first set of address lines;
   a second set of cross-point resistive elements connected to the second set of address lines; and
   at least one of a pull-up cross-point resistive element connected to the first set of address lines, and a pull-down cross-point resistive element connected to the second set of address lines.

2. The addressing circuit of claim 1, wherein each of the cross-point resistive elements of claim 1 comprises a same first conductive layer, a same second conductive layer, and a same semiconductor layer provided between the first conductive layer and the second conductive layer.

3. The addressing circuit of claim 1, wherein the cross-point memory array comprises a plurality of cross-point memory elements, each including a cross-point resistive element in series with a write-once circuit element, wherein one of the cross-point memory elements has an input connected to the pull-up cross-point resistive element and an output connected to the pull-down cross-point resistive element.

4. The addressing circuit of claim 3, wherein the first and second set of cross-point resistive elements, the pull-up and pull-down cross-point resistive elements, and the cross-point memory elements are formed in the same fabrication process.

5. The addressing circuit of claim 3, wherein the first and second set of cross-point resistive elements, the pull-up and pull-down cross-point resistive elements, and the cross-point resistive elements in the memory elements have substantially the same temperature coefficient of resistivity.

6. The addressing circuit of claim 3, wherein the first and second set of cross-point resistive elements, the pull-up and pull-down cross-point resistive elements, and the cross-point resistive elements in the memory elements are formed from substantially the same materials and include the same cross-point structure.

7. The addressing circuit of claim 3, wherein a resistance of at least one of the pull-up cross-point resistive element and the pull-down cross-point resistive element is approximately equal to $R_{low} * X$, wherein $R_{low}$ is a resistance of the one of the cross-point memory elements in a low impedance state and $X$ is a range between 0.1 and 10 inclusive.

8. The addressing circuit of claim 3, further comprising a first sense line operable to detect a binary state of the one of the cross-point memory elements, the first sense line including a first sense line cross-point resistive element connected to the pull-up cross-point resistive element and the one of the cross-point memory elements.

9. The addressing circuit of claim 8, further comprising a second sense line operable to detect a binary state of the one of the cross-point memory elements, the second sense line including a second sense line cross-point resistive element connected to the pull-down cross-point resistive element and the one of the cross-point memory elements.

10. The addressing circuit of claim 9, wherein the first and second set of cross-point resistive elements, the pull-up and pull-down cross-point resistive elements, the cross-point resistive elements in the memory elements, the first sense line cross-point resistive element, and the second sense line cross-point resistive element include diodes.

11. The addressing circuit of claim 10, wherein anodes of the first set of cross-point resistive elements and the first sense line cross-point resistive element are connected to an output of the pull-up cross-point resistive element and cathodes of the second set of cross-point resistive elements and the second sense line cross-point resistive element are connected to an input of the pull-down cross-point resistive element.

12. A memory circuit comprising:
a cross-point memory array having first and second sets of transverse electrodes with respective memory elements formed at the crossing-points of the first and second set electrodes, each memory element including, a cross-point resistive element; and
an addressing circuit comprising:
a first set of cross-point resistive elements connected between the first set of address lines and the first set of memory array electrodes;
a second set of cross-point resistive elements connected between the second set of address lines and the second set of memory array electrodes;
a set of pull-up cross-point resistive elements connected to the first set of address lines and first set of transverse electrodes; and
a set of pull-down cross-point resistive elements connected to the second set of address lines and the second set of transverse electrodes.

13. The memory circuit of claim 12, wherein the addressing circuit further comprises at least one sense line including a sense line cross-point resistive element connected to at least one of the first set of transverse electrodes and the second set of transverse electrodes.

14. The memory circuit of claim 13, wherein the cross-point resistive elements for each memory element, the first set of cross-point resistive elements, the second set of cross-point resistive elements, the set of pull-up and the set of pull-down cross-point resistive elements, and the sense line cross-point resistive element each comprises a same first conductive layer, a same second conductive layer, and substantially the same semiconductor layer provided between the first conductive layer and the second conductive layer.

15. The memory circuit of claim 13, wherein the cross-point resistive elements for each memory element, the first set of cross-point resistive elements, the second set of cross-point resistive elements, the set of pull-up and the set of pull-down cross-point resistive elements, and the sense line cross-point resistive element each are formed in the same fabrication process.

16. The memory circuit of claim 13, wherein the cross-point resistive elements for each memory element, the first set of cross-point resistive elements, the second set of cross-point resistive elements, the set of pull-up and the set of pull-down cross-point resistive elements, and the sense line cross-point resistive element have substantially the same temperature coefficient of resistivity.

17. The addressing circuit of claim 13, wherein a resistance of each of the set of pull-up and the set of pull-down cross-point resistive elements is approximately equal to Rlow * X, wherein Rlow is a resistance of a cross-point resistive element included with one of the memory elements in a low impedance state and X is a range between 0.1 and 10 inclusive.

18. The memory circuit of claim 13, wherein the cross-point resistive elements for each memory element, the first set of cross-point resistive elements, the second set of cross-point resistive elements, the set of pull-up and the set of pull-down cross-point resistive elements, and the sense line cross-point resistive element each comprises a diode.

19. The memory circuit of claim 12, further comprising a plurality of stacked integrated circuits, each integrated circuit including the memory circuit of claim 12 and being addressable in parallel to read or write data from one or more of the plurality of stacked integrated circuits.

20. A method for determining the state of a memory element of a plurality of memory elements in a cross-point memory array, the method comprising:
addressing the memory element by applying predetermined electrical signals to a first set of address lines including a first set of cross-point resistive elements connected to the memory element and applying predetermined electrical signals to a second set of address lines including a second set of cross-point resistive elements connected to the memory element;
generating a current using at least one of a pull-up cross-point resistive element connected to the first set of address lines and a pull-down cross-point resistive element connected to the second set of address lines; and
sensing a binary state of the memory element based on the generated current and using at least one sense line connected to at least one of the pull-up cross-point resistive element and the pull-down cross-point resistive element and further connected to the memory element.

21. The method of claim 20, further comprising applying a predetermined electrical signal to the at least one sense line for enabling or preventing writing to the addressed memory element.

22. The method of claim 20, wherein the at least one sense line includes a sense line cross-point resistive element.

23. The method of claim 22, wherein the memory element, the first set of cross-point resistive elements, the second set of cross-point resistive elements, the pull-up and pull-down cross-point resistive elements, and the sense line cross-point resistive element have the same cross-point structure and are formed using substantially the same materials.

24. The method of claim 20, wherein a resistance of at least one of the pull-up cross-point resistive element and the pull-down cross-point resistive element is approximately equal to Rlow*X, wherein Rlow is a resistance of the memory elements in a low impedance state and X is a range between 0.1 and 10 inclusive.

25. An apparatus including a memory array having at least one memory element, the apparatus comprising:

means for addressing a memory element in the memory array by applying predetermined electrical signals to a first set of address lines including a first set of cross-point resistive elements connected to the memory element and applying predetermined electrical signals to a second set of address lines including a second set of cross-point resistive elements connected to the memory element;

means for generating a current using at least one of a pull-up cross-point resistive element connected to the first set of address lines and a pull-down cross-point resistive element connected to the second set of address lines; and means for sensing a binary state of the memory element based on the generated current and using at least one sense line connected to at least one of the pull-up cross-point resistive element and the pull-down cross-point resistive element and further connected to the memory element.

26. The apparatus of claim 25, further comprising means for applying a predetermined electrical signal to the at least one sense line for enabling or preventing writing to the addressed memory element.

27. The apparatus of claim 25, wherein the at least one sense line includes a sense line cross-point resistive element.

28. The apparatus of claim 27, wherein the memory element, the first set of cross-point resistive elements, the second set of cross-point resistive elements, the pull-up and pull-down cross-point resistive elements, and the sense line cross-point resistive element have the same cross-point structure and are formed using substantially the same materials.

29. The apparatus of claim 25, wherein a resistance of at least one of the pull-up cross-point resistive element and the pull-down cross-point resistive element is approximately equal to Rlow*X, wherein Rlow is a resistance of the memory elements in a low impedance state and X is a range between 0.1 and 10 inclusive.

* * * * *